(12) United States Patent
Nakano

(10) Patent No.: US 7,852,130 B2
(45) Date of Patent: Dec. 14, 2010

(54) VOLTAGE DETECTION CIRCUIT AND VOLTAGE DETECTION METHOD

(75) Inventor: Hiroyasu Nakano, Saitama (JP)

(73) Assignee: Sony Corporation, Tokyo (JP)

( * ) Notice: Subject to any disclaimer, the term of this patent is extended or adjusted under 35 U.S.C. 154(b) by 15 days.

(21) Appl. No.: 12/424,072

(22) Filed: Apr. 15, 2009

(65) Prior Publication Data

US 2009/0289695 A1 Nov. 26, 2009

(30) Foreign Application Priority Data

May 21, 2008 (JP) ............................. 2008-133482

(51) Int. Cl.
*H03L 7/00* (2006.01)
*H03K 5/22* (2006.01)

(52) U.S. Cl. ..................... 327/143; 327/205; 327/60; 327/72; 327/73

(58) Field of Classification Search ................ None
See application file for complete search history.

(56) References Cited

U.S. PATENT DOCUMENTS

| | | | | | |
|---|---|---|---|---|---|
| 5,313,112 | A | * | 5/1994 | Macks | 327/143 |
| 6,163,183 | A | * | 12/2000 | Azimi et al. | 327/142 |
| 6,249,162 | B1 | * | 6/2001 | Inoue | 327/205 |
| 6,556,478 | B2 | * | 4/2003 | Willis et al. | 365/185.09 |
| 6,801,060 | B2 | * | 10/2004 | Ikehashi et al. | 327/80 |
| 7,030,668 | B1 | * | 4/2006 | Edwards | 327/143 |
| 7,109,761 | B2 | * | 9/2006 | Isomura | 327/77 |

* cited by examiner

*Primary Examiner*—Tuan Lam
(74) *Attorney, Agent, or Firm*—Oblon, Spivak, McClelland, Maier & Neustadt, L.L.P.

(57) ABSTRACT

Disclosed herein is a voltage detection circuit including: a voltage detection section; a first voltage determination section; and a second voltage determination section.

4 Claims, 3 Drawing Sheets

VOLTAGE DETECTION CIRCUIT AND VOLTAGE DETECTION METHOD

BACKGROUND OF THE INVENTION

1. Field of the Invention

The present invention relates to a voltage detection circuit and a voltage detection method.

2. Description of the Related Art

In order to operate an electronic circuit in a stable manner, a reset-voltage detection circuit is generally used. When a power-supply voltage supplied to the electronic circuit becomes equal to or lower than a reset voltage determined in advance, the reset-voltage detection circuit detects the power-supply voltage becoming equal to or lower than the reset voltage and resets a power-supply block employed in the reset-voltage detection circuit as a block which operates by receiving the power-supply voltage in order to supply a power to the electronic circuit.

FIG. 3 is an explanatory block diagram showing the existing reset-voltage detection circuit 10. As shown in the explanatory block diagram of FIG. 3, the existing reset-voltage detection circuit 10 for detecting a reset voltage employs a reset IC (Integrated Circuit) 11 and a power-supply block 12.

The reset IC 11 normally supplies a signal set at a high level to a CE terminal of the power-supply block 12 from an OUT terminal of the reset IC 11. Receiving a power-supply voltage denoted by reference notation. Power IN at a VIN terminal of the power supply block 12, the power-supply block 12 is made capable of operating by the high-level signal received from the reset IC 11.

When a power-supply voltage Power IN becomes equal to or lower than a reset voltage and the reset IC 11 detects this phenomenon through a VIN terminal of the reset IC 11, the reset IC 11 supplies a signal at a low level to the CE terminal of the power-supply block 12. Receiving the low-level signal received from the reset IC 11 at the CE terminal, the power-supply block 12 stops its operation, that is, the power-supply block 12 is reset.

When the power-supply block 12 is reset, the current consumed by the power-supply block 12 decreases. Thus, a voltage detected by the reset IC 11 at the VIN terminal rises. This is because a voltage drop D0 through a resistor R0 also decreases as well. When the voltage detected by the reset IC 11 at the VIN terminal rises to a level higher than the reset voltage, the low-level signal supplied by the reset IC 11 to the power-supply block 12 changes to the signal set at the high level. When the low-level signal supplied by the reset IC 11 to the power-supply block 12 changes to the signal set at the high level, the power-supply block 12 resumes its operation.

Let us think a case in which, at a point of time the power-supply voltage Power IN becomes equal to 2 V detected by the reset IC 11 through the VIN terminal, the reset IC 11 supplies the signal at a low level to a CE terminal of the power-supply block 12. Since the power-supply voltage Power IN is an analog voltage, the power-supply voltage Power IN may repeatedly vary its level back and forth over a small range such as a range of about 2 V±0.01 V. In this case, the signal output by the reset IC 11 to the power-supply block 12 also repeatedly changes back and forth over a small range.

In order to solve this problem, the reset IC 11 is normally provided with a hysteresis of about several tens of mV so that the signal output by the reset IC 11 to the power-supply block 12 does not repeatedly change back and forth over a small range even if the power-supply voltage Power IN repeatedly varies its level back and forth over a small range.

Depending on the configuration of the reset-voltage detection circuit 10, however, the power-supply voltage Power IN may repeatedly change back and forth over a range greater than several tens of mV. For example, the power-supply voltage Power IN may repeatedly change back and forth over a range of 2 V. In this case, by merely providing the reset IC 11 with a hysteresis, it may be impossible to cope with such large voltage changes. In order to solve this problem, the existing reset-voltage detection circuit 10 is provided with a capacitor for setting a large time constant for avoiding consecutive ON and OFF operations (or oscillations) of the power-supply block 12.

SUMMARY OF THE INVENTION

However, the capacitor provided in the existing reset-voltage detection circuit 10 to serve as a capacitor for setting a large time constant does not solve the basic cause of the large voltage changes of the power-supply voltage Power IN. Thus, there has been raised a problem that the consecutive ON and OFF operations (or oscillations) of the power-supply block 12 occur, depending on the conditions. In addition, the capacitor provided for the existing reset-voltage detection circuit 10 increases the size of the reset-voltage detection circuit 10 and raises the cost of the reset-voltage detection circuit 10.

By the way, such a hysteresis can be set by making use of a microcomputer. In this case, however, the use of the microcomputer raises a problem of an increased power consumption. In particular, it is desirable to provide the reset-voltage detection circuit 10 with as simple a configuration as possible in the case of a reset-voltage detection circuit 10 designed for an apparatus desired to consume little power. That is to say, in a system having large changes in power-supply voltage, it is necessary to assure a large hysteresis and simplify the configuration of the reset-voltage detection circuit.

Addressing the problems described above, inventors of the present invention have proposed a new and improved voltage detection circuit allowing a hysteresis capable of coping with large changes in power-supply voltage to be set at any arbitrary value and proposed a new and improved voltage detection method to be adopted in the voltage detection circuit.

In order to solve the problems described above, in accordance with a mode of the present invention, there is provided a voltage detection circuit employing: a voltage detection section configured to output a first signal when detecting a downward transition of a supplied voltage to a relatively low level equal to or lower than a first voltage or output a second signal when detecting the supplied voltage in a state of being higher than the first voltage and when detecting an upward transition of the supplied voltage to a relatively high level higher than a second voltage higher than the first voltage after the downward transition of the supplied voltage to the relatively low level equal to or lower than the first voltage; a first voltage determination section configured to put a first transistor in a turned-on state by making use of the second signal output by the voltage detection section so as to put a second transistor in a turned-off state in order to set a fraction of the supplied voltage at a first value so as to generate a first fractional voltage, which is to be actually compared with a voltage determined in advance in order to determine whether or not the supplied voltage itself is equal to or lower than the first voltage, in accordance with a first voltage ratio; and a second voltage determination section configured to put the first transistor in a turned-off state by making use of the first signal output by the voltage detection section so as to put the second transistor in a turned-on state in order to set a fraction of the supplied voltage at a second value smaller than the first value so as to generate a second fractional voltage, which is to be actually compared with the voltage determined in advance in order to determine whether or not the supplied voltage itself is higher than the second voltage, in accordance with a second voltage ratio.

In accordance with the configuration described above, the voltage detection section outputs a first signal when detecting a downward transition of a supplied voltage to a relatively low level equal to or lower than a first voltage or outputting a second signal when detecting the supplied voltage in a state of being higher than the first voltage and when detecting an upward transition of the supplied voltage to a relatively high level higher than a second voltage higher than the first voltage after the downward transition of the supplied voltage to the relatively low level equal to or lower than the first voltage. The first voltage determination section sets the first voltage in accordance with a first voltage ratio whereas the second voltage determination section sets the second voltage in accordance with a second voltage ratio. As a result, a difference between the first voltage determined by the first voltage determination section and the second voltage determined by the second voltage determination section can be set as a hysteresis of the voltage detection circuit.

The first voltage determination section may include a first resistor and a second resistor which are connected to each other in series whereas the second voltage determination section may include a third resistor connected in parallel to the second resistor.

In order to solve the problems described above, in accordance with another mode of the present invention, there is provided a voltage detection method including the steps of: determining whether or not a supplied voltage is higher than a first voltage set in accordance with a first voltage ratio; outputting a first signal if the supplied voltage is determined to have become equal to or lower than the first voltage at the first-voltage detection step; changing a comparison voltage to be compared with the supplied voltage from the first voltage to a second voltage higher than the first voltage when a first transistor is put in a turned-off state by the first signal output at the first-signal outputting step in order to put a second transistor in a turned-on state; determining whether or not the supplied voltage is higher than the second voltage set in accordance with a second voltage ratio; outputting a second signal if the supplied voltage is determined to have become higher than the second voltage at the second-voltage detection step; and changing the comparison voltage from the second voltage to the first voltage when the first transistor is put in a turned-on state by the second signal output at the second-signal outputting step in order to put the second transistor in a turned-off state.

As described above, in accordance with the embodiment of the present invention, it is possible to present a new and improved voltage detection circuit allowing a hysteresis to be set at any arbitrary value by making use of a simple configuration and present a new and improved voltage detection method to be adopted in the voltage detection circuit.

DETAILED DESCRIPTION OF THE PREFERRED EMBODIMENT

Figure 1:
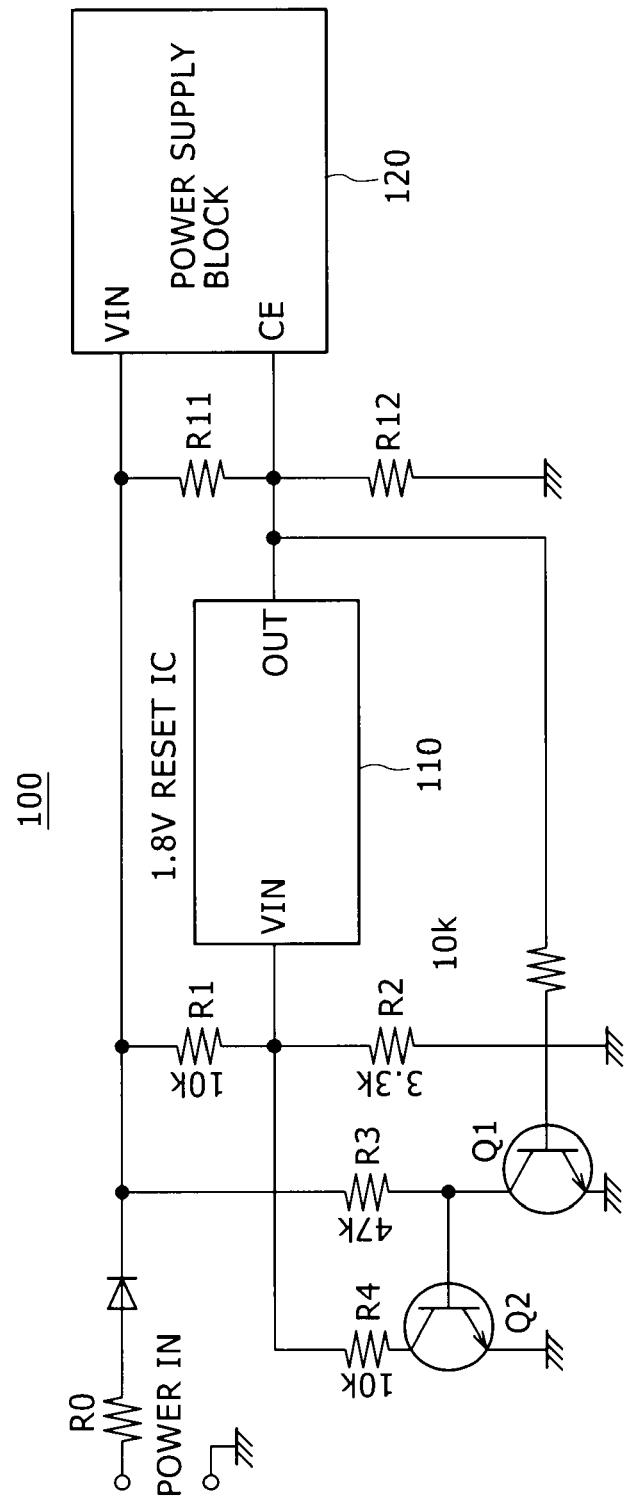
FIG. 1 is an explanatory diagram showing the configuration of a reset-voltage detection circuit according to an embodiment of the present invention.

A preferred embodiment of the present invention is explained in detail by referring to diagrams as follows. It is to be noted that configuration elements described in this invention specification and shown in the diagrams as elements having essentially functions identical with each other are denoted by the same reference numeral or the same reference notation and each of such configuration elements is explained once in order to avoid duplications of descriptions.

First of all, a reset-voltage detection circuit 100 according to the embodiment of the present invention is explained. FIG. 1 is an explanatory diagram showing the configuration of the reset-voltage detection circuit 100 according to the embodiment of the present invention. The configuration of the reset-voltage detection circuit 100 according to the embodiment of the present invention is explained by referring to the explanatory diagram of FIG. 1 as follows.

As shown in the explanatory diagram of FIG. 1, the reset-voltage detection circuit 100 according to the embodiment of the present invention employs a reset IC 110, a power-supply block 120, resistors R1, R2, R3 and R4 as well as N-channel transistors Q1 and Q2.

The reset IC 110 detects the magnitude of a power-supply voltage Power IN at a VIN terminal of the reset IC 110 and outputs a signal from an OUT terminal of the reset IC 110 to a CE terminal of the power-supply block 120. Depending on the detected magnitude of the power-supply voltage Power IN, the signal output by the reset IC 110 can be set at a high or low level. As a standalone unit, the reset IC 110 of this embodiment has a hysteresis of about 50 mV.

If the power-supply voltage Power IN is higher than a second level determined in advance, the reset IC 110 outputs a signal set at a high level from its OUT terminal to the CE terminal of the power-supply block 120. If the power-supply voltage Power IN is equal to or lower than a first level determined in advance, on the other hand, the reset IC 110 outputs a signal set at a low level from its OUT terminal to the CE terminal of the power-supply block 120.

In this embodiment, if a voltage supplied to the VIN terminal of the reset IC 110 is equal to or lower than a predetermined voltage of 1.8 V, the reset IC 110 outputs a signal set at a low level from its OUT terminal to the CE terminal of the power-supply block 120.

The power-supply block 120 receives the power-supply voltage Power IN and supplies a power to a variety of circuits provided at a stage following the power-supply block 120. The circuits at the stage following the power-supply block 120 are not shown in the diagram of FIG. 1 though. The power-supply block 120 receives the power-supply voltage Power IN at a VIN terminal of the power-supply block 120.

The power-supply block 120 is put in an operating state in accordance with a high-level signal supplied by the reset IC 110 to the CE terminal of the power-supply block 120. The power-supply block 120 stops the operating state thereof in accordance with a low-level signal supplied by the reset IC 110 to the CE terminal of the power-supply block 120. That is to say, the power-supply block 120 stops the operating state thereof when the level of the power-supply voltage Power IN becomes equal to or lower than the first level determined in advance. As the level of the power-supply voltage Power IN becomes equal to or higher than the second level determined in advance, the reset IC 110 outputs a signal set at a high level from the OUT terminal of the reset IC 110 to the CE terminal of the power-supply block 120 in order to resume the operation carried out by the power-supply block 120.

The first N-channel transistor Q1 is put in a turned-off state when the reset IC 110 outputs a signal set at a low level from the OUT terminal of the reset IC 110. With the first N-channel transistor Q1 put in a turned-off state, the second N-channel transistor Q2 is put in a turned-on state.

The resistors R1 and R2 determine the level of a voltage supplied to the VIN terminal of the reset IC 110 as a voltage to be compared by the reset IC 110 with a voltage determined in advance. In other words, the ratio of the resistance of the resistor R1 to the resistance of the resistor R2 can be set at any arbitrary value which determines a relatively large fraction of the power-supply voltage Power IN to be actually compared with the so-called first voltage determined in advance. By comparing the relatively large fraction of the power-supply voltage Power IN with the voltage determined in advance, it is possible to determine whether or not the power-supply voltage Power IN is equal to or lower than the first voltage which is a voltage determined in advance at a relatively low level.

In this embodiment, the resistance of the resistor R1 is set at 10 kilo-ohms whereas the resistance of the resistor R2 is set at 3.3 kilo-ohms. Let reference notation V denote the electric potential of the power-supply voltage Power IN whereas reference notation Vo denote an electric potential supplied to the VIN terminal of the reset IC 110 in this embodiment. Thus, the electric potential Vo can be expressed in terms of the electric potential V of the power-supply voltage Power IN, the resistance of the resistor R1 and the resistance of the resistor R2 in accordance with Eq. 1 as follows.

$$V_0 = \frac{3.3}{10+3.3} \times V \quad (1)$$
$$= \frac{3.3}{13.3} \times V$$

Accordingly, when the electric potential V of the power-supply voltage Power IN becomes equal to or lower than 7.2 V, the electric potential Vo supplied to the VIN terminal of the reset IC 110 becomes equal to or lower than 1.79 V≈1.8 V so that, at a point of time the electric potential V of the power-supply voltage Power IN becomes equal to or lower than 7.2 V, the reset IC 110 is put in an operating state outputting a signal set at a low level from the OUT terminal of the reset IC 110 to the CE terminal of the power-supply block 120.

The resistor R3 is a resistor through which a current is flowing to the first N-channel transistor Q1 whereas the resistor R4 is a resistor through which a current is flowing to the second N-channel transistor Q2. The ratio of the resistance of the resistor R1 to the combined resistance of the resistors R2 and R4 connected in parallel to each other can be set at any arbitrary value which determines a relatively small fraction of the power-supply voltage Power IN to be actually compared with the so-called second voltage determined in advance. By comparing the relatively small fraction of the power-supply voltage Power IN with the voltage determined in advance, it is possible to determine whether or not the power-supply voltage Power IN is higher than the second voltage which is a voltage determined in advance at a level higher than the level of the first voltage mentioned before.

That is to say, while the reset IC 110 is outputting a signal set at the low level, the resistors R1, R2 and R4 determining the relatively small fraction of the power-supply voltage Power IN also indirectly set the second voltage serving as a recovery voltage for restoring a signal output by the reset IC 110 at a high level from the signal set at the low level. The ratio of the resistance of the resistor R1 to the combined resistance of the resistors R2 and R4 connected in parallel to each other can be set at any arbitrary value selected in accordance with the resistances of the resistors R1, R2 and R4.

In this embodiment, the resistance of the resistor R4 is set at 10 kilo-ohms. With the resistance of the resistor R4 set at 10 kilo-ohms, the resistance of the resistor R1 set at 10 kilo-ohms and the resistance of the resistor R2 set at 3.3 kilo-ohms, the electric potential Vo supplied to the VIN terminal of the reset IC 110 can be expressed in terms of the electric potential V of the power-supply voltage Power IN as well as the resistances of the resistors R1, R2 and R4 in accordance with Eq. 2 as follows.

$$V_0 = \frac{\frac{3.3 \times 10}{3.3+10}}{10 + \frac{3.3 \times 10}{3.3+10}} \times V \quad (2)$$
$$= \frac{33}{166} \times V$$

Accordingly, when the electric potential V of the power-supply voltage Power IN rises to 9.0 V, the electric potential Vo supplied to the VIN terminal of the reset IC 110 also rises to 1.79 V≈1.8 V, at which the aforementioned voltage determined in advance is set, as well so that, at a point of time the electric potential V of the power-supply voltage Power IN rises to 9.0 V, the reset IC 110 is put in an operating state outputting a signal set at a high level from the OUT terminal of the reset IC 110 to the CE terminal of the power-supply block 120.

The configuration of the reset-voltage detection circuit 100 according to the embodiment of the present invention has been described so far by referring to the diagram of FIG. 1. Next, the operation of the reset-voltage detection circuit 100 according to the embodiment of the present invention is explained as follows.

Figure 2:
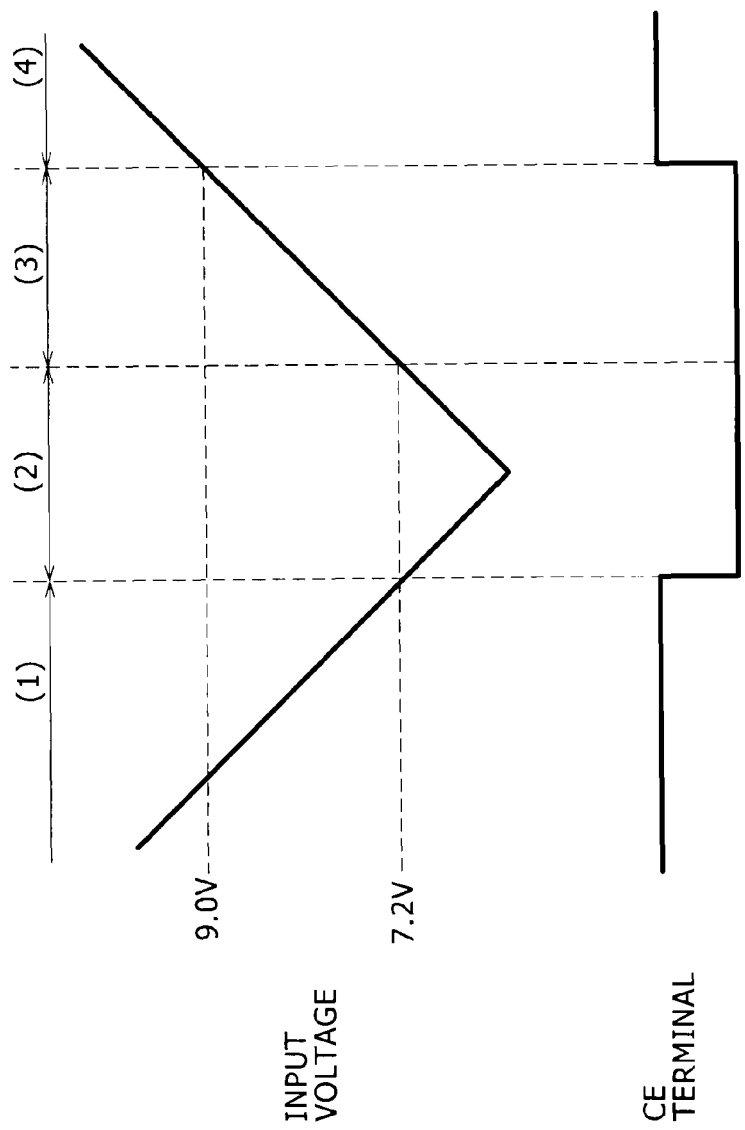
FIG. 2 is an explanatory timing diagram showing timing charts of signals appearing during operations carried out by the reset-voltage detection circuit according to the embodiment of the present invention.
Figure 3:
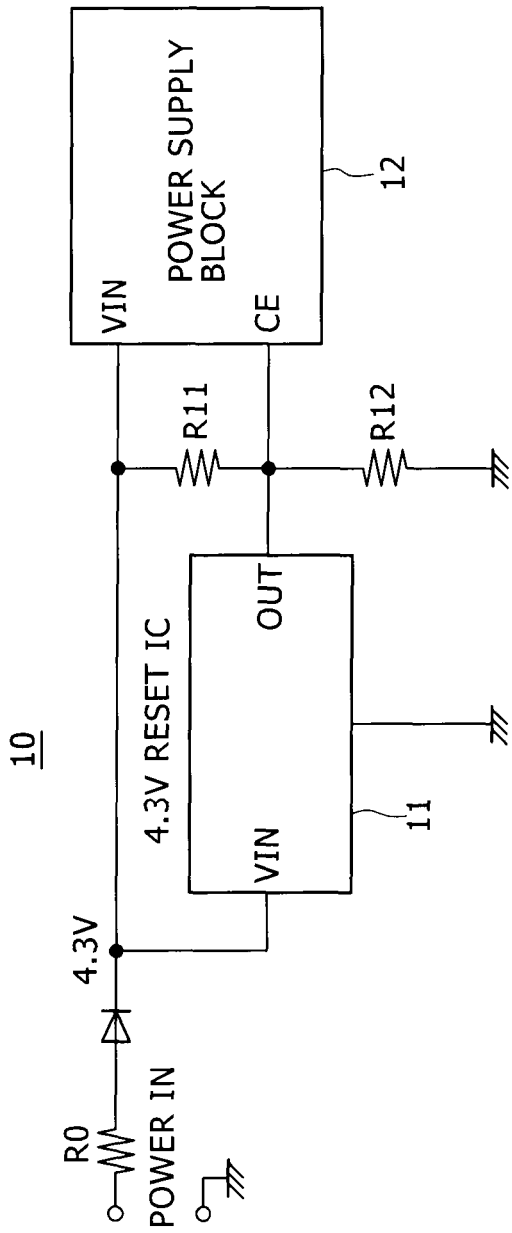
FIG. 3 is an explanatory block diagram showing the existing reset-voltage detection circuit.

FIG. 2 is an explanatory timing diagram showing timing charts of signals appearing during operations carried out by the reset-voltage detection circuit 100 according to the embodiment of the present invention.

When the power-supply voltage Power IN is higher than 7.2 V, that is, when the electric potential Vo supplied to the VIN terminal of the reset IC 110 is higher than 1.8 V, the reset IC 110 outputs the second signal set at a high level from the OUT terminal of the reset IC 110 to the CE terminal of the power-supply block 120 during period (1) shown in the timing diagram of FIG. 2.

Since the reset IC 110 is outputting the second signal set at a high level from the OUT terminal of the reset IC 110 to the CE terminal of the power-supply block 120 during period (1), the first N-channel transistor Q1 is put in a turned-on state. With the first N-channel transistor Q1 put in a turned-on state, no current is flowing to the base of the second N-channel transistor Q2. Thus, the second N-channel transistor Q2 is put in a turned-on state. As a result, no current is flowing through the second N-channel transistor Q2. Accordingly, no current is flowing through the resistor R4. That is to say, the resistor R4 is put in a state of being electrically disconnected from the reset IC 110. In this state, the electric potential Vo supplied to the VIN terminal of the reset IC 110 has a relatively high level because the electric potential Vo is determined merely by the ratio of the resistance of the resistor R1 to the resistance of the resistor R2. By comparing the relatively high level of electric potential Vo supplied to the VIN terminal of the reset IC 110 with the predetermined voltage of 1.8 V, it is possible to determine whether or not the power-supply voltage Power IN itself is equal to or lower than the first voltage of 7.2 V.

As the power-supply voltage Power IN becomes equal to or lower than the first voltage of 7.2 V during period (2) shown in the timing diagram of FIG. 2, that is to say, as the electric potential Vo supplied to the VIN terminal of the reset IC 110 at a level expressed by Eq. 1 becomes equal to or lower than the predetermined voltage of 1.8 V, the reset IC 110 outputs a first signal set at a low level from the OUT terminal of the reset IC 110 to the CE terminal of the power-supply block 120.

Since the reset IC 110 is outputting the first signal set at a low level from the OUT terminal of the reset IC 110 to the CE terminal of the power-supply block 120 during period (2), the first N-channel transistor Q1 is put in a turned-off state. With the first N-channel transistor Q1 put in a turned-off state, a current is flowing to the base of the second N-channel transistor Q2. Thus, the second N-channel transistor Q2 is put in a turned-on state. As a result, a current is flowing through the second N-channel transistor Q2. Accordingly, a current is also flowing through the resistor R4 as well. That is to say, the resistor R4 is put in a state of being electrically connected to the reset IC 110.

The resistor R4 is connected to the reset IC 110 in parallel to the resistor R2. In this state, the electric potential Vo supplied to the VIN terminal of the reset IC 110 has a relatively low level because the electric potential Vo is determined by the ratio of the resistance of the resistor R1 to the combined resistance of the resistor R2 and resistor R4 which are connected to each other in parallel. By comparing the relatively high level of the electric potential Vo supplied to the VIN terminal of the reset IC 110 with the predetermined voltage of 1.8 V, it is possible to determine whether or not the power-supply voltage Power IN itself is higher than the second voltage of 9.0 V.

Since the power-supply voltage Power IN which is lower than the first voltage of 7.2 V is much lower than the second voltage of 9.0 V during period (2), the electric potential Vo supplied to the VIN terminal of the reset IC 110 also becomes much lower than the predetermined voltage of 1.8 V. With the resistor R4 connected to the reset IC 110, in order for the electric potential Vo supplied to the VIN terminal of the reset IC 110 to become higher than the predetermined voltage of 1.8 V, it is necessary to raise the power-supply voltage Power IN to a level higher than the second voltage of 9 V.

Let us assume that the power-supply voltage Power IN rises to the first voltage of 7.2 V again after becoming lower than the first voltage of 7.2 V in a transition from period (2) to period (3). Even if the power-supply voltage Power IN rises to the first voltage of 7.2 V, the electric potential Vo supplied to the VIN terminal of the reset IC 110 is still lower than the predetermined voltage of 1.8 V because the ratio of the combined resistance of the resistor R2 and resistor R4 which are connected to each other in parallel to the resistance of the resistor R1 is relatively low. Thus, the reset IC 110 is sustaining the first signal output from the OUT terminal of the reset IC 110 to the CE terminal of the power-supply block 120 at the low level as it is during period (3).

As the power-supply voltage Power IN is restored to the level about equal to the second voltage of 9 V in a transition from period (3) to period (4), however, the electric potential Vo supplied to the VIN terminal of the reset IC 110 at a level expressed by Eq. 2 is also restored to the predetermined voltage of 1.8 V as well. When the electric potential Vo supplied to the VIN terminal of the reset IC 110 at a level expressed by Eq. 2 is restored to the predetermined voltage of 1.8 V, the reset IC 110 is outputting a second signal set at a high level from the OUT terminal of the reset IC 110 to the CE terminal of the power-supply block 120 during period (4).

During period (4), the reset IC 110 is outputting the second signal set at a high level from the OUT terminal of the reset IC 110 to the CE terminal of the power-supply block 120 in the same way as period (1). Thus, the first N-channel transistor Q1 is put in a turned-on state by the second signal set at a high level. With the first N-channel transistor Q1 put in a turned-on state, no current is flowing to the base of the second N-channel transistor Q2. Thus, the second N-channel transistor Q2 is put in a turned-off state. As a result, no current is flowing through the second N-channel transistor Q2. Accordingly, no current is flowing through the resistor R4. That is to say, the resistor R4 is again put in a state of being electrically disconnected from the reset IC 110.

When the resistor R4, which has been electrically connected to the reset IC 110 in parallel to the resistor R2 so far during periods (2) and (4) is again put in a state of being electrically disconnected from the reset IC 110, the electric potential Vo supplied to the VIN terminal of the reset IC 110 has a relatively high level because the electric potential Vo is determined merely by the ratio of the resistance of the resistor R1 to the resistance of the resistor R2. Thus, the relatively high level of the electric potential Vo supplied to the VIN terminal of the reset IC 110 further rises from the predetermined voltage of 1.8 V due to the increase in power-supply voltage Power IN.

Accordingly, the reset IC 110 outputs the first signal set at the low level from the OUT terminal of the reset IC 110 to the CE terminal of the power-supply block 120 merely when the electric potential Vo supplied to the VIN terminal of the reset IC 110 becomes equal to or lower than the predetermined voltage of 1.8 V, that is, merely when the power-supply voltage Power IN itself becomes equal to or lower than the first voltage of 7.2 V and sustains the first signal as it is till the electric potential Vo supplied to the VIN terminal of the reset IC 110 becomes higher than the predetermined voltage of 1.8 V, that is, till the power-supply voltage Power IN itself becomes higher than the second voltage of 9.0 V. As a result, the reset-voltage detection circuit 100 shown in the diagram of FIG. 1 has a hysteresis of about 1.8 V (=9 V−7.2 V), which can be proved to be equal to the predetermined voltage of 1.8 V.

As described above, the reset IC 110 serving as standalone unit can have a hysteresis of about 50 mV. By adding the resistors R1, R2, R3 and R4 as well as the N-channel transistors Q1 and Q2 each serving as a switching device to the reset IC 110 in accordance with the embodiment as described above, however, the reset-voltage detection circuit 100 as a whole can be provided with a hysteresis for controlling the electric potential Vo supplied to the VIN terminal of the reset IC 110 in accordance with the state of a signal output from the OUT terminal of the reset IC 110 to the CE terminal of the power-supply block 120.

By controlling the electric potential Vo supplied to the VIN terminal of the reset IC 110 through the use of the resistors R1, R2, R3 and R4 as well as the N-channel transistors Q1 and Q2 each serving as a switching device in accordance with the embodiment as described above, it is possible to provide the reset-voltage detection circuit 100 with a hysteresis larger than the hysteresis of the reset IC 110 serving as standalone unit while keeping the configuration of the reset-voltage detection circuit 100 simple. In addition, the hysteresis given to the reset-voltage detection circuit 100 can be set at any arbitrary value which is determined by the resistances of the resistors R1, R2 and R4.

As a result, in the case of an application in which the power-supply voltage Power IN changes much, the hysteresis given to the reset-voltage detection circuit 100 can be set at a large value useable for coping with the large change in power-supply voltage Power IN by making use of a simple configuration so that the signal output from the OUT terminal of the reset IC 110 to the CE terminal of the power-supply block 120 does not change every time the power-supply voltage Power IN crosses a threshold level.

The above description explains operations carried out by the reset-voltage detection circuit 100. As described above, in accordance with the embodiment of the present invention, by adding the resistors R1, R2, R3 and R4 as well as the N-channel transistors Q1 and Q2 each serving as a switching device to the reset IC 110 in a simple configuration in accordance with the embodiment as described above, it is possible to provide the reset-voltage detection circuit 100 with a hysteresis larger than the hysteresis of the reset IC 110 serving as standalone unit.

The preferred embodiment of the present invention has been described above by referring to diagrams. It is needless to say, however, that implementations of the present invention are by no means limited to the preferred embodiment. It is obvious that, inspired by the preferred embodiment, a person skilled in the art is capable of coming up with a variety of modified versions or changed configurations within ranges defined by claims appended to this invention specification. However, such modified versions and changed configurations are regarded as versions and changes naturally falling within the technological range of the present invention.

For example, each of the resistors R1, R2 and R4 employed in the reset-voltage detection circuit 100 according to the embodiment has a constant resistance. However, implementations of the present invention are by no means limited to such a scheme according to the preferred embodiment. That is to say, at least, one of the resistors R1, R2 and R4 may have a variable resistance. By employing at least one of the resistors R1, R2 and R4 as a resistor having a variable resistance, the hysteresis can be set at any arbitrary value even after the reset-voltage detection circuit has been configured.

In addition, it should be understood by those skilled in the art that a variety of modifications, combinations, sub-combinations and alterations may occur, depending on design requirements and other factors insofar as they are within the scope of the appended claims or the equivalents thereof.

The present application contains subject matter related to that disclosed in Japanese Priority Patent Application JP 2008-133482 filed in the Japan Patent Office on May 21, 2008, the entire content of which is hereby incorporated by reference.

It should be understood by those skilled in the art that various modifications, combinations, sub-combinations and alterations may occur depending on design requirements and other factor in so far as they are within the scope of the appended claims or the equivalents thereof.

What is claimed is:

1. A voltage detection circuit comprising:
   a voltage detection section configured to output a first signal when detecting a downward transition of a supplied voltage to a relatively low level equal to or lower than a first voltage or output a second signal when detecting said supplied voltage in a state of being higher than said first voltage and when detecting an upward transition of said supplied voltage to a relatively high level higher than a second voltage higher than said first voltage after said downward transition of said supplied voltage to said relatively low level equal to or lower than said first voltage;
   a first voltage determination section configured to put a first transistor in a turned-on state by making use of said second signal output by said voltage detection section so as to put a second transistor in a turned-off state in order to set a fraction of said supplied voltage at a first value so as to generate a first fractional voltage, which is to be actually compared with a voltage determined in advance in order to determine whether or not said supplied voltage itself is equal to or lower than said first voltage, in accordance with a first voltage ratio; and
   a second voltage determination section configured to put said first transistor in a turned-off state by making use of said first signal output by said voltage detection section so as to put said second transistor in a turned-on state in order to set a fraction of said supplied voltage at a second value smaller than said first value so as to generate a second fractional voltage, which is to be actually compared with said voltage determined in advance in order to determine whether or not said supplied voltage itself is higher than said second voltage, in accordance with a second voltage ratio.

2. The voltage detection circuit according to claim 1 wherein
   said first voltage determination section includes a first resistor and a second resistor which are connected to each other in series, and
   said second voltage determination section includes a third resistor connected in parallel to said second resistor.

3. A voltage detection method comprising the steps of:
   determining whether or not a supplied voltage is higher than a first voltage set in accordance with a first voltage ratio;
   outputting a first signal when said supplied voltage is determined to have become equal to or lower than said first voltage at said first-voltage detection step;
   changing a comparison voltage to be compared with said supplied voltage from said first voltage to a second voltage higher than said first voltage when a first transistor is put in a turned-off state by said first signal output at said first-signal outputting step in order to put a second transistor in a turned-on state;
   determining whether or not said supplied voltage is higher than said second voltage set in accordance with a second voltage ratio;
   outputting a second signal when said supplied voltage is determined to have become higher than said second voltage at said second-voltage detection step; and
   changing said comparison voltage from said second voltage to said first voltage when said first transistor is put in a turned-on state by said second signal output at said second-signal outputting step in order to put said second transistor in a turned-off state.

4. A voltage detection circuit comprising:
   voltage detection means for outputting a first signal when detecting a downward transition of a supplied voltage to a relatively low level equal to or lower than a first voltage or outputting a second signal when detecting said supplied voltage in a state of being higher than said first voltage and when detecting an upward transition of said supplied voltage to a relatively high level higher than a second voltage higher than said first voltage after said downward transition of said supplied voltage to said relatively low level equal to or lower than said first voltage;

first voltage determination means for putting a first transistor in a turned-on state by making use of said second signal output by said voltage detection means so as to put a second transistor in a turned-off state in order to set a fraction of said supplied voltage at a first value so as to generate a first fractional voltage, which is to be actually compared with a voltage determined in advance in order to determine whether or not said supplied voltage itself is equal to or lower than said first voltage, in accordance with a first voltage ratio; and second voltage determination means for putting said first transistor in a turned-off state by making use of said first signal output by said voltage detection means so as to put said second transistor in a turned-on state in order to set a fraction of said supplied voltage at a second value smaller than said first value so as to generate a second fractional voltage, which is to be actually compared with said voltage determined in advance in order to determine whether or not said supplied voltage itself is higher than said second voltage, in accordance with a second voltage ratio.

* * * * *